(12) United States Patent
Zoels et al.

(10) Patent No.: US 10,171,069 B1
(45) Date of Patent: Jan. 1, 2019

(54) SWITCH CONTROLLER FOR ADAPTIVE REVERSE CONDUCTION CONTROL IN SWITCH DEVICES

(71) Applicant: General Electric Company, Schenectady, NY (US)

(72) Inventors: Thomas Alois Zoels, Munich (DE); Fabio Carastro, Munich (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/881,346

(22) Filed: Jan. 26, 2018

(51) Int. Cl.
*H03K 17/00* (2006.01)
*H03K 17/08* (2006.01)

(52) U.S. Cl.
CPC ..... *H03K 17/08* (2013.01); *H03K 2017/0806* (2013.01)

(58) Field of Classification Search
CPC ......... H03K 17/0412; H03K 17/04123; H03K 17/0416; H03K 17/04163; H03K 17/042; H03K 17/0426; H03K 17/082; H03K 17/0822; H03K 17/161; H03K 17/165; H03K 19/00369; H03K 19/00384
See application file for complete search history.

(56) References Cited

U.S. PATENT DOCUMENTS

| 6,385,028 | B1 | 5/2002 | Kouno | |
|---|---|---|---|---|
| 7,535,739 | B2 * | 5/2009 | Kidokoro | H03K 17/08 323/222 |
| 7,570,102 | B2 * | 8/2009 | Tai | H02M 1/08 327/108 |
| 8,471,622 | B2 | 6/2013 | Ishikawa et al. | |
| 8,901,989 | B2 | 12/2014 | Mehta et al. | |
| 2010/0066441 | A1 | 3/2010 | Liu | |
| 2014/0346891 | A1 | 11/2014 | Kang et al. | |

FOREIGN PATENT DOCUMENTS

| CN | 205725693 U | 11/2016 |
|---|---|---|
| CN | 206547048 U | 10/2017 |

OTHER PUBLICATIONS

Huselstein, J.J., et al.; "Use of the MOSFET channel reverse conduction in an inverter for suppression of the integral diode recovery current", 1993 Fifth European Conference on Power Electronics and Applications, vol. 2, pp. 431-436, Brighton, Sep. 13-16, 1993.
Eberle, Wilson et al.; "A New Resonant Gate-Drive Circuit With Efficient Energy Recovery and Low Conduction Loss", IEEE Transactions on Industrial Electronics, vol. 55, Issue: 5, pp. 2213-2221, May 2008.
Anthony, Philip, et al.; "High-Speed Resonant Gate Driver With Controlled Peak Gate Voltage for Silicon Carbide MOSFETs", IEEE Transactions on Industry Applications, vol. 50, Issue: 1, pp. 573-583, Jan.-Feb. 2014.
U.S. Appl. No. 15/397,588, filed Jan. 3, 2017, Garcia Clemente, et al.

\* cited by examiner

*Primary Examiner* — An T Luu
(74) *Attorney, Agent, or Firm* — GE Global Patent Operation; Nitin Joshi

(57) ABSTRACT

The application discloses the control of switches, such as metal-oxide semiconductor field effect transistors (MOSFETs) devices, during surge events. The switch controllers and methods for operation thereof discuss methods for providing driving signals to the switch for adjusting the mode of operation based on the voltage and/or current thresholds as sensed by the system and/or by the switch controller.

23 Claims, 6 Drawing Sheets

US 10,171,069 B1

SWITCH CONTROLLER FOR ADAPTIVE REVERSE CONDUCTION CONTROL IN SWITCH DEVICES

BACKGROUND

The subject matter disclosed herein relates to switch devices and controllers, and more specifically, to methods and systems that may manage switch devices during power surges in an adaptive manner.

This section is intended to introduce the reader to certain aspects of art that may be related to aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Switch devices may be used in electrical systems to couple and/or decouple power supplies and an electrical load. Systems may employ automatically driven switching circuitry and/or switch devices, such as transistors, to implement electrical converters, such as traction converters and rectifiers that may convert alternating current (AC) electricity to direct current (DC) electricity and buck converters that may change an output voltage of a DC power supply with reduced loss. In certain situations, the switch devices may be subjected to electrical stress during electrical surge events, which may occur due to fluctuations in the power supply and/or imbalances in the load. The electrical stresses may lead to excessive power dissipation and electrical stress in the switch and/or in the system, which may lead to thermal failure of components and/or the system.

BRIEF DESCRIPTION

Certain embodiments commensurate in scope with the originally claimed invention are summarized below. These embodiments are not intended to limit the scope of the claimed invention and are intended only to provide a brief summary of possible forms of the invention. Indeed, the invention may encompass a variety of forms that may be similar to or different from the embodiments set forth below.

In one embodiment, a switch controller for control of voltage-controlled power switch devices is described. The switch controller may include an output stage coupled to a control terminal of the voltage-controlled power switch device. The output stage may receive a driving signal and provide a driving voltage to the voltage-controlled power switch device. The switch controller may also have a voltage sensor that measures a voltage across the power switch device. The switch controller may, further, include a digital processing unit that receives a switching command and the measured the voltage, and provides the driving signal to the output stage. The digital processing unit may compare the measured voltage with a limit voltage or a threshold voltage. Based on this comparison, the digital processing unit may cause the output stage to provide a first voltage as the driving voltage when the measurement is above the threshold, and may cause the output stage to provide a second voltage as the driving voltage when the measurement is below the threshold.

In another embodiment, a system having switching circuitry is described. The system may include a voltage-controlled power switch device that may be coupled to a power source and a load. The system may also include gate drive circuitry coupled to the voltage-controlled power switch device. The gate drive circuitry may include a driver coupled to a control terminal of the power switch device. The gate driver circuitry may also include processing circuitry coupled to the driver. The processing circuitry may determine that a current surge event across the power switch device is occurring based on a measurement of the voltage-controlled power switch device. The processing circuitry may also configure the driver to provide a first voltage as a driving voltage when there is no current surge event or a weak surge event, and may configure the driver to provide a second voltage as the driving voltage when there is a strong surge event. The processing circuitry may further receive a switching instruction, and may cause the driver to send a signal to the voltage-controlled power switch device.

A further embodiment in this disclosure includes a method for operation of metal-oxide-semiconductor field-effect transistor (MOSFET) in a reverse current mode using a gate drive controller. The method may include processes such as measuring a drain-source voltage between a drain of the MOSFET device and a source of the MOSFET device, comparing the measured voltage with a limit or threshold voltage to identify a surge event. The method may also include processes for receiving switching instructions. Upon receiving the switching instructions, the method includes processes for providing to the MOSFET a first gate-source voltage that places the MOSFET in a body diode mode during a strong surge event, or a second gate-source voltage that places the MOSFET in a third-quadrant conduction mode outside the surge event or during a weak surge event.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
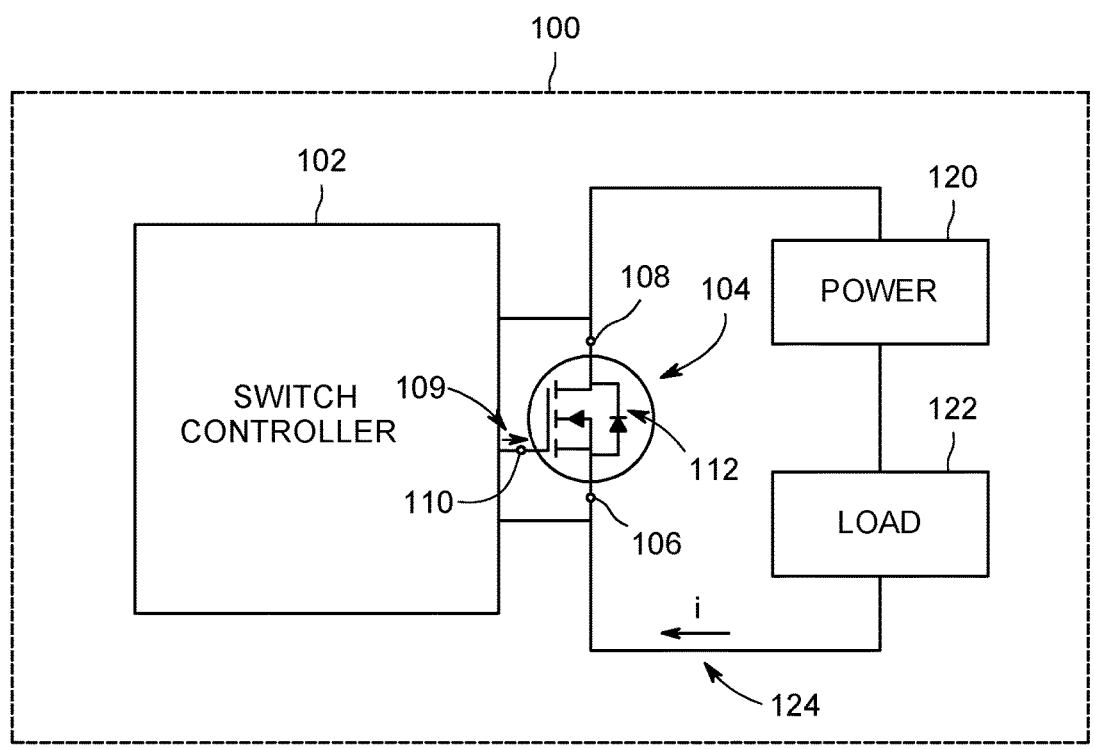
FIG. 1 is a schematic diagram illustrating an embodiment of a system having a switch that couples a power source and/or a load and having a switch controller operably coupled to the switch.

One or more specific embodiments of the present subject matter will be described below. In an effort to provide a concise description of these embodiments, certain features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The application may make reference to certain electrical measurement metrics. As such, it should be understood that "W" may refer to watts, "J" may refer to joules, "A" may refer to amperes, and "V" may refer to volts. It should also be understood that thermal metrics, such as degree Celsius, may be indicated by "° C.," as customary in the art.

Switch devices are used in electrical systems to couple and/or decouple power supplies and electrical loads. Many systems employ automatically driven switch devices, such as metal oxide semiconductor field effect transistors (MOSFETs), to implement electrical converters, such as traction converters and rectifiers that convert alternating current (AC) electricity to direct current (DC) electricity and buck converters that change an output voltage of a DC power supply with reduced loss.

The use of certain wide-bandgap materials (e.g., silicon carbide (SiC)) to fabricate source, gate, and drain regions and/or channels in a MOSFET switch device enables advantages, such as reduced device dimensions, tighter channel control, and reduced leak currents, compared to other materials. However, at reduced dimensions, the response of a SiC switch device during surge events may lead to large resistance and substantial voltage drop, particularly during surge events that induce large reverse currents (e.g., currents that induce reverse current conduction in the MOSFET device). As a result of this voltage drop, the power dissipated during surge events may be large and may lead to thermal stress, which can cause failure of the switch device and/or of the system surrounding the switch device.

In the present application, reference is made to surge events, or surge current events. A surge current event may be defined with reference to the specifications of an electronic device, such as transistor and/or a diode. Surge events may be events in which the current may cause the junction of the device (e.g., a diode junction, a transistor junction) to heat up to a temperature well above the rated maximum values. The surge current event may, for example, be defined as the current that exceeds a maximum allowed pulse-width-dependent peak value of a half-sinusoidal surge current, applied at an instant when the power semiconductor is operating at its maximum junction temperature. Typically, a maximum allowed (non-repetitive) peak current during a 10 ms sine half-wave may be found on the datasheet containing device specification. The surge current event may also be defined based on an Pt value specified for the device.

With the foregoing in mind, presently disclosed embodiments are directed to systems and methods for operating a switch. The devices may, for example, reduce the aforementioned voltage drop in a switch due to a current surge event that induces reverse currents in the switch. The devices may also be used, for example, to operate the switch during in the reverse current mode. More specifically, present embodiments are directed toward controlling operation of the switch such that current predominantly or primarily traverses one of two possible electrical paths through the switch operating, when operating in a reverse conduction mode. The first electrical path (referred to herein as the third quadrant conduction path or the MOSFET channel conduction path) includes the channel of the MOSFET switch, while the second electrical path (also referred to as the body diode conduction path) includes a body diode of the switch. The particular current path is selected by the switch controller based on the measured conditions (e.g., source-drain current, source-drain voltage, temperature) of the switch device to mitigate the voltage drop and, as consequence, the power dissipated in the switch device due to the surge event may be reduced. It should be further noted that, for certain systems, the switch is designed to operate regularly in reverse conduction mode, and the surge event may be a large current surge event that substantially increases the reverse current.

With the foregoing in mind, FIG. 1 illustrates an embodiment of a system 100 that having switch controller 102 (also referred to as a gate driver unit) to facilitate operation of at least one switch 104 of the system 100. As illustrated, the switch controller 102 is operably coupled to the switch 104. For the illustrated embodiment, the switch 104 is a transistor, such as a SiC MOSFET transistor, having a drain terminal 106, a source terminal 108, and a control terminal 109. The switch controller 102 electrically monitors the switch 104 through terminals 106 and/or 108 of the switch 104. As detailed below, monitoring may include monitoring voltages and/or currents. It should be noted that other measurements, including temperature, may be obtained from terminals 106 and/or 108, or via a communicatively coupled temperature-sensing device, as detailed herein.

For the illustrated embodiment, the switch controller 102 controls the switch 104 by providing a suitable driving voltage 110 to the control terminal 109 of the switch 104. The driving voltage 110 may be, for example, a voltage signal that changes one or more electrical properties (e.g., resistivity, impedance, conductivity) between drain terminal 106 and source terminal 108 of the switch 104. The voltage between the control terminal 109 and the source terminal 106 generally determines the amount of current that flows between the source terminal 108 and drain terminal 106, through the transistor channel (e.g., switch 104). For the illustrated embodiment, the switch 104 is a MOSFET switch device that includes a body diode 112 that is parasitic or intentionally placed for the purposes described herein. For such embodiments, the body diode 112 allows a one-directional flow of current between terminals 106 and 108 as a function of a voltage difference between terminals 106 and 108, and may not be directly controlled by the driving voltage 110 provided through the control terminal 109.

In the illustrated embodiment of the system 100, the switch 104 is used to regulate electrical currents through the electrical circuit disposed between a power source 120 and a load 122. As such, in certain embodiments, the switch 104 may be a component of a voltage regulator, a rectifier, a voltage converter (e.g., a buck converter, a traction power converter), and/or a surge protector. The switch 104 is controlled by the switch controller 102 to provide a particular voltage signal to the load 122 when the power source 120 is unreliable or unstable. Conversely, the switch 104 may be controlled by the switch controller 102 to protect the power source 120 from load demands from the load 122 that exceed predetermined safety margins for operation. For example, a power surge 124 or current surge event is a disturbance that may be managed by the use of the switch 104. The power surge 124 may be caused by an excessive demand from the load 122 or a disturbance in the generation in the power source 120, and may lead to large currents in the switch 104.

As discussed above, when the illustrated switch 104 is operating in reverse conduction mode, the switch includes two possible electrical paths (i.e., the third quadrant conduction path and the body diode conduction path) between the source terminal 106 and the drain terminal 108. When the switch 104 is operating in a direct or forward conduction mode, the body diode 112 generally blocks current from flowing in reverse between the drain terminal 108 and the source terminal 106 and the current (i.e., the charge carriers) may travel through the switch channel. By contrast, when the switch 104 is operating in reverse conduction mode, current may flow between the source terminal 106 and the drain terminal 108 through the channel of the switch, also referred to herein as the third quadrant conduction path, and/or through the body diode electrical path, depending on the driving voltage 110 delivered to the control terminal 109. That is, as discussed in more detail below, when operating in reverse conduction mode, current predominately flows using either the third quadrant conduction path or the body diode electrical path, based on the driving voltage 110 received from the switch controller 102. As further detailed below, in certain embodiments, when the voltage of the power surge 124 is relatively low, the third quadrant conduction path may be used, whereas in other situations, the body diode path may be used.

Figure 2:
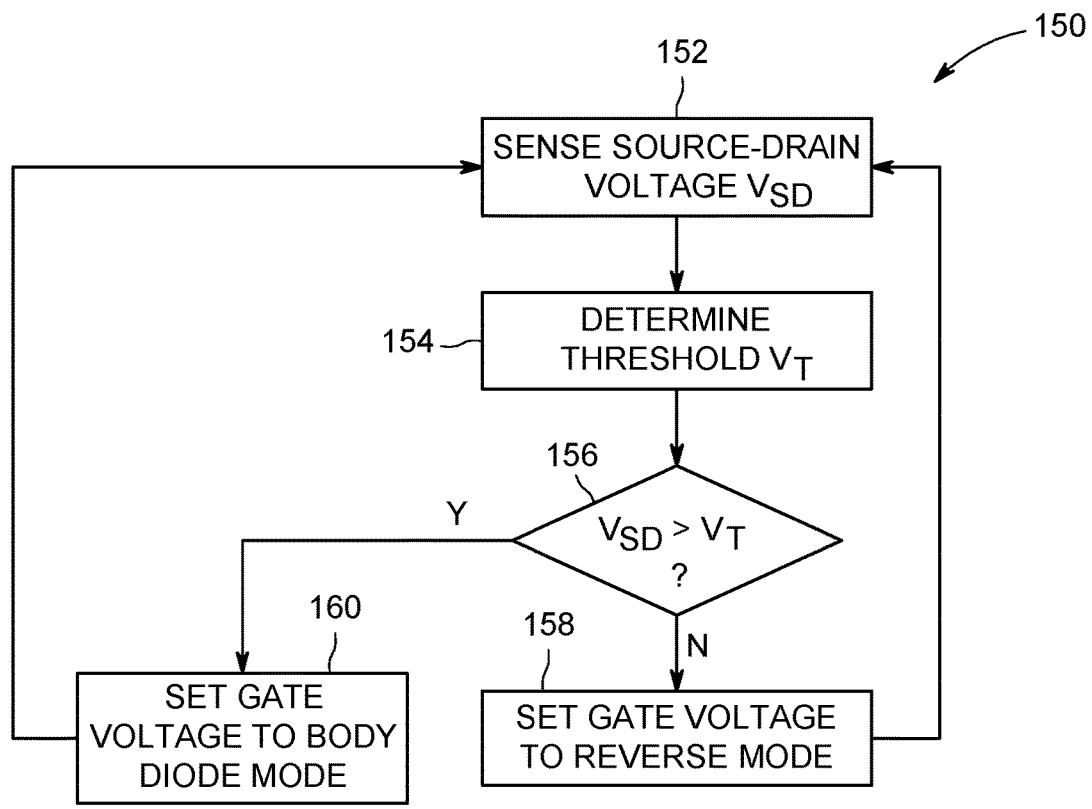
FIG. 2 is a flow diagram illustrating an embodiment of a method for controlling operation of the switch using the switch controller of FIG. 1.

FIG. 2 is a flow diagram illustrating an embodiment of a method 150 for adjusting a driving voltage 110 provided by the switch controller 102 to select between the third quadrant conduction path and the body diode conduction path of the switch 104 during a surge event 124 when the switch 104 is operating in reverse conduction mode. Method 150 may be performed by a switch controller 102 or other suitable processing or control circuitry of the system 100. The illustrated method 150 begins at block 152, wherein the switch controller 102 senses or measures the voltage between the terminals 106 and 108 of the switch 100. For example, the voltage sensing of block 152 may be performed during a surge event 124. The voltage may be measured as the voltage difference between the source voltage and the drain voltage, $V_{SD}$. A negative source-drain voltage (e.g., $V_{SD}<0$) indicates that the switch 104 is operating in forward conduction mode, while a positive source-drain voltage (e.g., $V_{SD}>0$) indicates that the switch 104 is operating in reverse conduction mode. It should be noted that in certain systems, the switch 104 is designed to operate strictly in forward conduction mode, and as such, the $V_{SD}$ may only be positive during a surge event 104. By contrast, in certain embodiments, the switch 104 may be designed to normally operate in the reverse conduction mode, and as such, a negative $V_{SD}$ does not necessarily indicate that a power surge 124 is taking place for such systems.

The illustrated method 150 continues at block 154, wherein the switch controller 102 determines a limit voltage ($V_{T-RCP}$) for operation of the switch 104. $V_{T-RCP}$ is, generally, a value for $V_{SD}$ in which it is suitable for the switch controller 102 to control the switch 104 to change between the third quadrant conduction path and the body diode conduction path during reverse conduction mode operation. $V_{T-RCP}$ may be determined based on previously measured (e.g., previously determined) characteristics of the switch device 104. In some embodiments, a look-up table or some other similar data structure stored in a memory associated with the switch controller 102 may be used to determine $V_{T-RCP}$ based on a measured parameter of the switch 104. $V_{T-RCP}$ may also be adjusted based on certain operational characteristics of the switch 104, such as the temperature or the age of the switch 104. The look-up table may also be used to provide adjustments to the $V_{T-RCP}$. For example, a look-up table for a particular switch 104 may include a list of $V_{T-RCP}$ values as a function of a measured temperature of the switch 104, as detailed below. Methods to determine $V_{T-RCP}$ are further detailed below.

Continuing through the illustrated method 150, at decision block 156, the switch controller 102 compares the measured source-drain voltage ($V_{SD}$) with the reverse conduction path limit voltage ($V_{T-RCP}$) to determine whether current should traverse the third quadrant conduction path or the body diode conduction path of the switch 104. This comparison may also be used to determine if the system 100 is undergoing a particular surge event 124 when operating in the reverse conduction mode. For example, as detailed below, at low voltages (e.g., $V_{SD}<V_{T-RCP}$) that are indicative of weak surge events or non-surge events, the switch controller 102 may control the switch 104 to select the third quadrant conduction path. Accordingly, in block 158, the switch controller 102 provides a suitable driving voltage 110 to the switch 104 to cause the reverse current to predominately flow through the third quadrant conduction path. By contrast, during string surge events, such as when $V_{SD}>V_{T-RCP}$, the switch controller 102 may control the switch 104 to select the body diode conduction path. Accordingly, in block 160, the switch controller 102 provides a suitable driving voltage 110 to the switch 104 to cause the reverse current to predominantly flow through the body diode 112.

Figure 3:
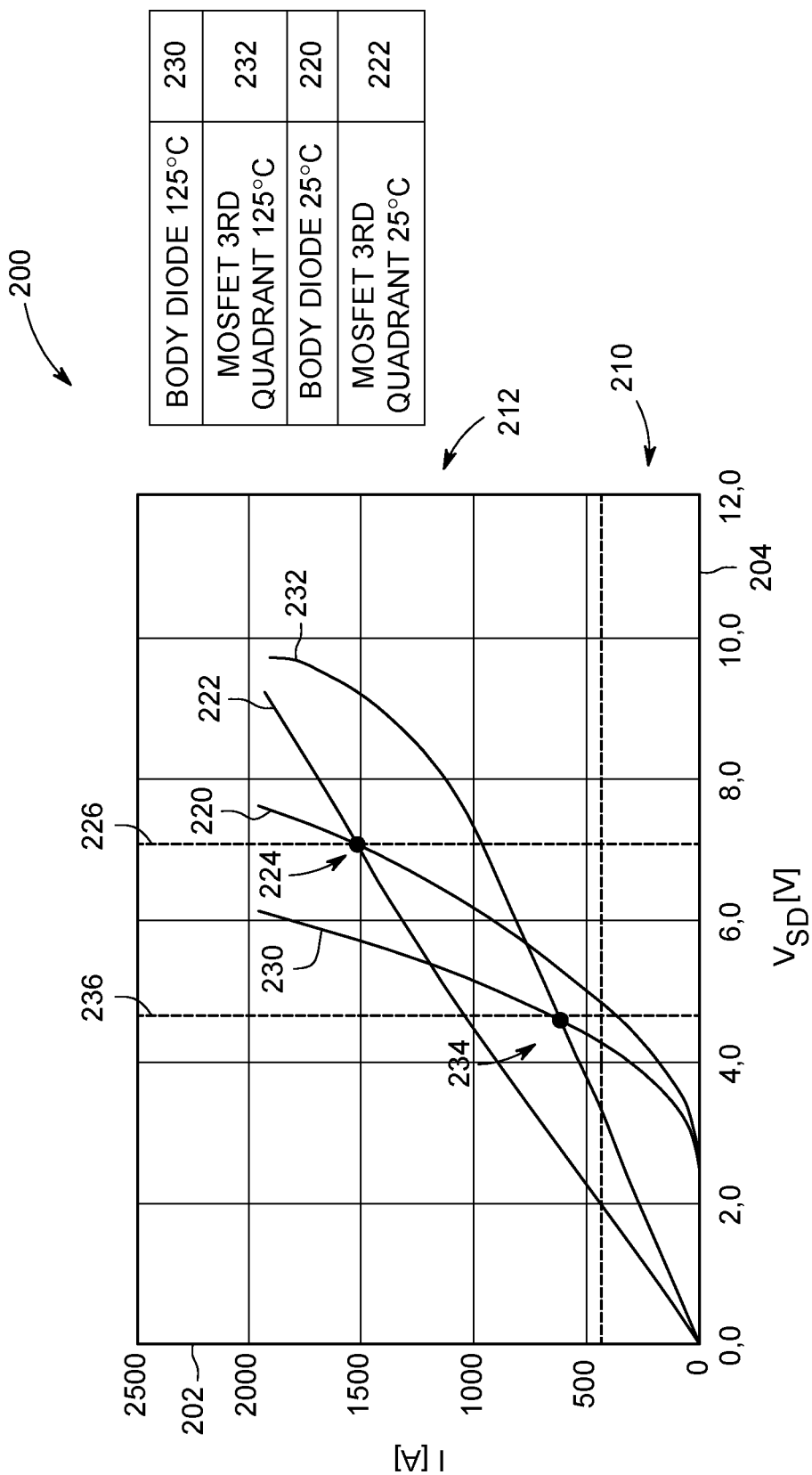
FIG. 3 is a chart illustrating current-voltage (IV) characteristics of an example embodiment of the switch of FIG. 1 in which the reverse current predominantly flows through either a third quadrant conduction path or a body diode conduction path of the switch at either 25° C. or at 125° C. during current surge events.

As discussed above, controlling the electrical path of the reverse current of the switch 104 during a surge event may limit undesirable effects of the surge event. For example, FIG. 3 is a chart 200 illustrating the current 202 of the switch 104 as a function of the source-drain voltage 204 of the switch 104 operating at different temperatures, wherein the current flows predominately through either the third quadrant conduction path or the body diode conduction path. As such, chart 200 in FIG. 3 illustrates how the reverse current path can limit the effects of surge currents, how limit voltages may be determined for a particular switch, and how the effects of the temperature may be compensated in the methods and systems described herein. The chart 200 includes a region 210 related to relatively low current surge events, and a region 212 related to relatively high current surge events.

In particular, curve 220 represents the IV behavior of the switch 104 in which the reverse current predominately flows thorough the body diode conduction path at 25° C., while the curve 222 represents the IV behavior of the switch 104 in which the reverse current predominately flows through the third quadrant conduction path at 25° C. For the switch represented in FIG. 3, curves 220 and 222 intersect at crossover point 224. The crossover point 224 can be used to determine a first limit voltage ($V_{T-RCP}$) 226 for the switch 104 when operating at 25° C. In accordance with the method 150 of FIG. 2, the switch controller 102 signals the switch 104 to use the body diode path when $V_{SD}$ is above the first $V_{T-RCP}$ 226, and signals the switch 104 to use the third quadrant conduction path when $V_{SD}$ is below the first $V_{T-RCP}$ 226. As such, when the switch 104 is controlled as disclosed herein at 25° C., the switch demonstrates IV behavior that corresponds to curve 220 when $V_{SD}$ below the first $V_{T-RCP}$ 226, and demonstrates IV behavior that corresponds to curve 222 when the $V_{SD}$ is above the first $V_{T-RCP}$ 226. Since the first $V_{T-RCP}$ 226 is determined based on the crossover point 224, the methods described herein enable a minimization of the voltage drop during current surge events. The reduction in the voltage drop may reduce the amount of thermal stress due to heat generated in the switch 104, as well as the overall conduction losses, during the surge event.

It is also presently recognized that changes in temperature can impact the IV behavior of the switch 104. Accordingly, in the chart 200 of FIG. 3, curve 230 represents the IV behavior of the switch 104 in which the reverse current predominately flows through the body diode conduction path at 125° C., while curve 232 represents the IV behavior of the switch 104 in which the reverse current predominately flows through the third quadrant conduction path at 125° C. Curves 230 and 232 intersect at crossover point 234, and the switch controller 102 can use the crossover point 234 to determine a second reverse conduction path limit voltage ($V_{T-RCP}$) 236 for the switch operating at 125° C. In this example, the second $V_{T-RCP}$ 236 (for the switch operating at 125° C.) is lower than the first $V_{T-RCP}$ 226 (for the switch operating at 25° C.). Thus, it may be appreciated that the switch controller 102 may adjust $V_{T-RCP}$ based on the temperature of the switch 104, as discussed above. Furthermore, the switch controller 102 may also include, or be communicatively coupled to, suitable sensors configured to measure the temperature of the switch 104. In certain embodiments, the switch controller 102 may also track the lifetime of the switch 104, for example, by storing the amount of time of operation of the switch (e.g., an uptime) in a memory of the controller 102. For such embodiments, the switch controller 102 may, additionally or alternatively, adjust $V_{T-RCP}$ according to the age of the switch. For example, a developer can measure the impact of age on IV behavior of a switch 104, and may store in a memory of the switch controller 102 a list of $V_{T-RCP}$ adjustments determined using the crossover points, as discussed above for temperature.

Figure 4:
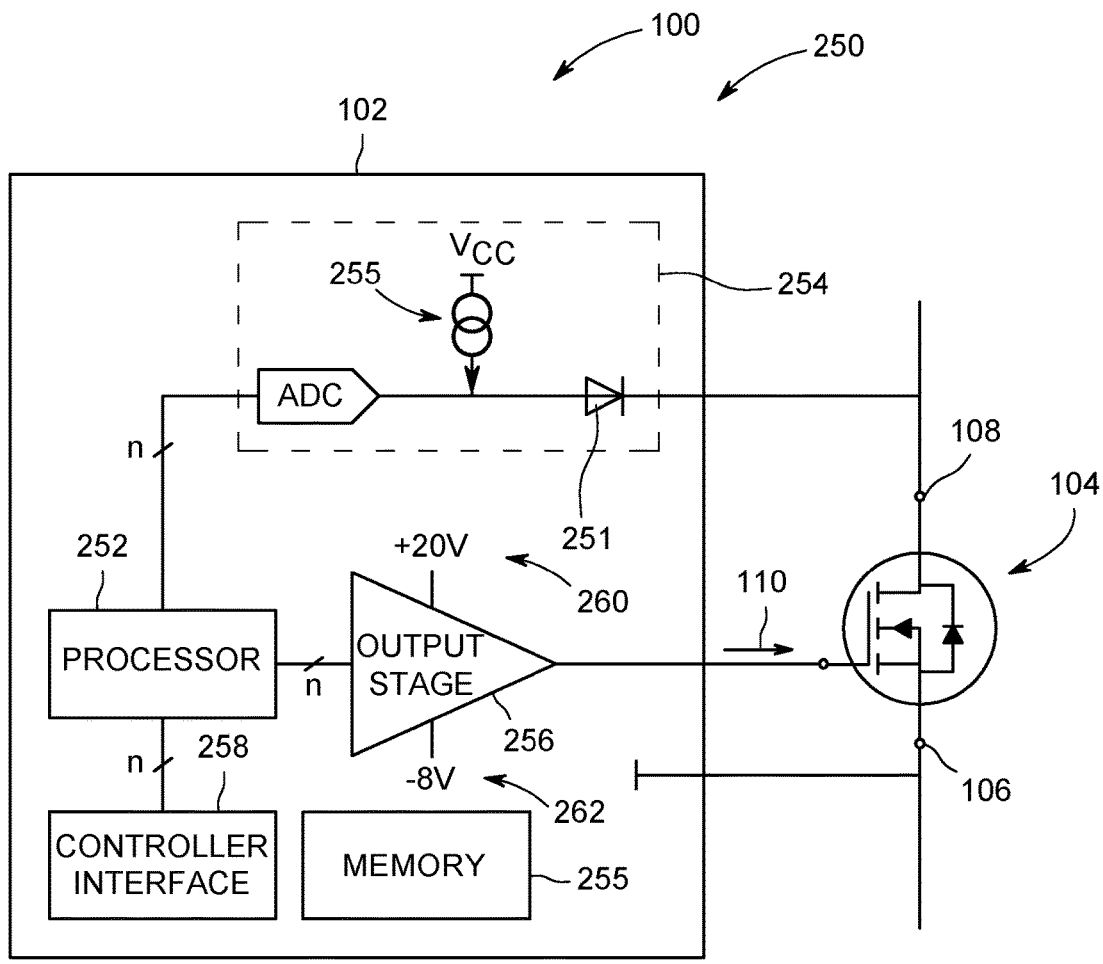
FIG. 4 is a schematic diagram of a portion of the system of FIG. 1 illustrating components of an embodiment of the switch controller.

FIG. 4 is a diagram 250 illustrating a portion of an embodiment of the system 100 of FIG. 1. Like in FIG. 1, the portion of the system 100 illustrated in FIG. 4 includes the switch controller 102 operatively coupled to the switch 104. For the example illustrated in FIG. 4, the switch 104 is a MOSFET switch, such as a silicon carbide (SiC) MOSFET device. The MOSFET switch 104 includes the source terminal 106, the drain terminal 108, and the gate terminal (e.g., control terminal 109), operably coupled to the switch controller 102, as discussed. In particular, as mentioned, the switch controller 102 generates and provides the driving voltage 110 to the gate terminal of the MOSFET switch 104 to control operation of the switch.

The illustrated switch controller 102 includes a processor 252 and a voltage sensor 254 that are communicatively coupled. For the illustrated embodiment, the voltage sensor 254 includes a blocking diode 251 disposed between a current source 253 and the source terminal 108. As illustrated, in certain embodiments, the voltage sensor 254 includes an analog-to-digital converter (ADC) that is operably coupled to the current source to monitor the voltage drop in the blocking diode 251. For the illustrated embodiment, the voltage measured by the voltage sensor 254, which may be the source-drain voltage $V_{SD}$, is provided to the processor 252 via an internal bus of the switch controller 102. While the illustrated embodiment shows a particular implementation for the voltage sensor 254, it should be understood that other measurement systems may be used. Moreover, as discussed above, temperature sensors may also be present in the switch controller 102 and may be coupled to the processor 252. The temperature sensors may, for example, be negative temperature coefficient (NTC) thermistors. Positive temperature coefficient (PTC) thermistors may also be used. The temperature sensors may monitor junction temperatures.

The processor 252 may receive the sensed voltage $V_{SD}$ and compare with the determined reverse conduction path limit voltage ($V_{T-RCP}$), as discussed above. $V_{T-RCP}$ may be retrieved from a memory 255, which may be part of the switch controller 102. Moreover, the processor 252 may receive other data, such as temperature and/or age of the switch, as discussed above, and determine $V_{T-RCP}$ accordingly. The processor 252 may perform a method, such as method 150 of FIG. 2, to compare $V_{SD}$ and $V_{T-RCP}$ and determine a suitable reverse current path (e.g., third quadrant conduction path or body diode conduction path) for the switch 104. Based on the determined reverse current path, the processor 252 provides driving signals to an output stage 256 to provide a particular driving voltage 110 to the gate terminal. The output stage 256 may, for example, provide a first voltage 260 (e.g., +20 V for certain SiC switches) that opens the MOSFET channel of the switch 104. The output stage 256 may, for example, provide a second voltage 256 (e.g., −8 V for certain SiC switches) that closes the MOSFET channel and, instead, shifts the current towards the body diode conduction path of the MOSFET switch 104. As such, the MOSFET device may operate in the manner discussed above to enable the aforementioned reduced voltage drop across the switch 104 during surge events.

As illustrated in FIG. 4, the switch controller 102 may also include a controller interface 258 that can be used by the system 100 to control the switch controller 102 and the switch 104. For example, when configured as a traction converter, the switch 104 may be operated in a suitable manner to provide electricity using direct current (DC) electricity from an alternating current (AC) power source. In another example, when configured as a buck converter, the switch 104 may be used to convert from a DC voltage to a second DC voltage with reduced losses. In such situations, the controller interface 258 may receive a command, which may be a digital (e.g., serial data, Ethernet protocol data, etc.), or an analog command (e.g., pulse width modulation (PWM) signal, frequency modulation (FM) signal, an amplitude signal, etc.) from suitable control or processing circuitry of the system 100. The controller interface 258 may receive and transmit to the processor 252 specifications for operation of the switch controller 102 and/or switch 104, such as the duty cycle of the switch 104. The processor 252 may relay or translate the message to the output stage 256, such that the output stage 256 can provide a suitable driving voltage 110. As an example, the processor 252 may relay a received PWM from the controller interface 258, and the output stage 256 may control the switch 104 based on the message. In another example, the processor 252 may receive, via the controller interface 258, a specification for a percentage value as a floating-point value, and the processor 252 may convert that information to an appropriate signal for the output stage 256, such as PWM signal.

Figure 5A:
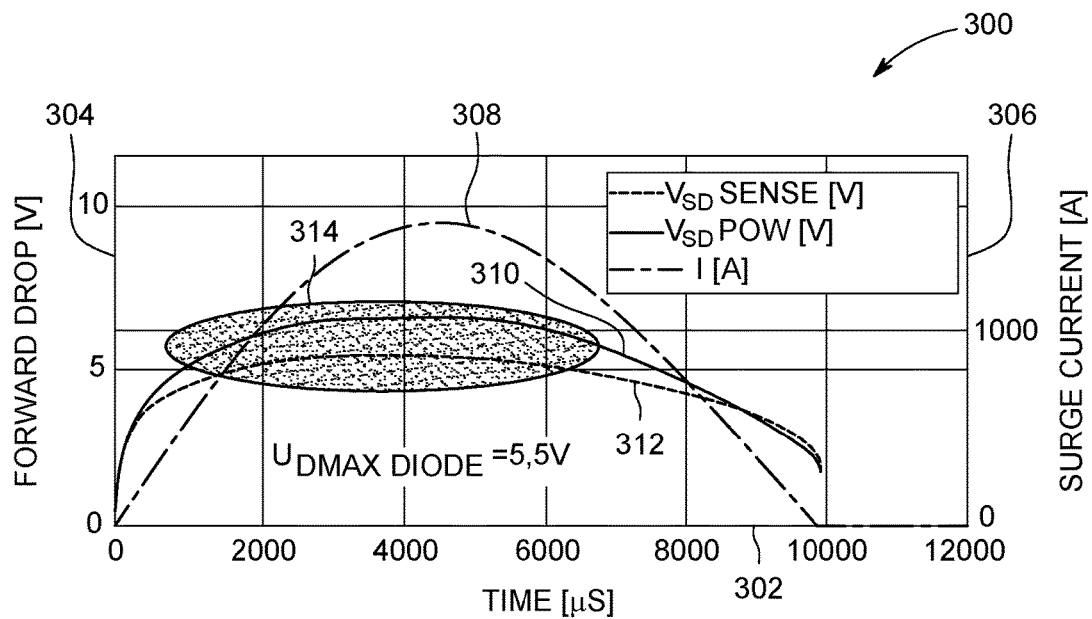
FIG. 5A is a chart illustrating a voltage drop response of an example silicon carbide (SiC) switch operating in reverse conduction mode during a current surge event, wherein the reverse current predominantly flows through the third quadrant conduction path of the switch, in accordance with an embodiment.
Figure 5B:
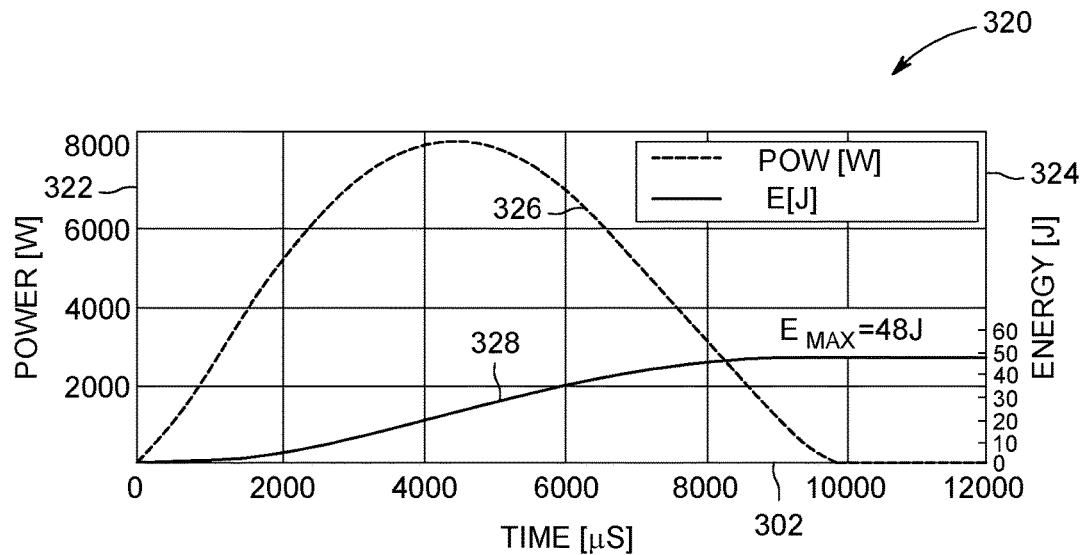
FIG. 5B is a chart illustrating a power dissipation response of the SiC switch of FIG. 5A operating in reverse conduction mode during the current surge event, wherein the reverse current predominantly flows through the body diode conduction path of the switch, in accordance with an embodiment.

Charts 300 in FIG. 5A and 320 in FIG. 5B illustrate the response over time 302 of a SiC MOSFET switch 104 operating in reverse conduction mode with the body diode conduction path selected during a current surge event. In chart 300 of FIG. 5A, voltage drop 304 refers to the voltage difference between the source and the drain (e.g., source-drain voltage or $V_{SD}$), and surge current 306 refers to the current induced in the switch due to the surge. Curve 308, associated with the surge current 306 axis, illustrates an example current surge experienced by the switch 104. As indicated by curve 308, the surge event in this example has a peak of about 1500 A. Curve 310 illustrates the $V_{SD}$ output across the switch 104 during the surge event, and curve 312 illustrates the $V_{SD}$ across the switch 104 as measured by an embodiment of the switch controller 102. As noted in region 314 of the chart 300, the maximum voltage drop under the surge event current (curve 308) is limited to 5.5 V when the body diode conduction path is selected. As mentioned, by limiting the peak voltage drop, present embodiments enable a reduction in the amount of power and heat produced in the diode of the switch 104.

Indeed, the associated chart 320 of FIG. 5B illustrates the amount of power and energy dissipated by the switch 104 as a function of time 302 during the current surge event indicated by curve 308 in FIG. 5A. As such, chart 320 indicates power 322 dissipated by the switch 104, as well as cumulative energy 324 dissipated by the SiC MOSFET switch 104, during the current surge event. Curve 326 indicates that the power dissipated by the switch follows the current surge (curve 308 of FIG. 5A), with a peak power of around 8000 W when the body diode conduction path is selected. Curve 328 indicates that the cumulative energy dissipated by the switch was of 48 J when the body diode conduction path is selected. As discussed above, in order to select the body diode conduction path of the switch 104, the control terminal 109 may be set to a gate voltage (i.e., gate-source voltage, or $V_{GS}$) that closes the MOSFET channel between source and drain of the switch 104. In the illustrated example, the gate-source voltage is set to −8 V to select the body diode conduction path of the switch 104.

Figure 6A:
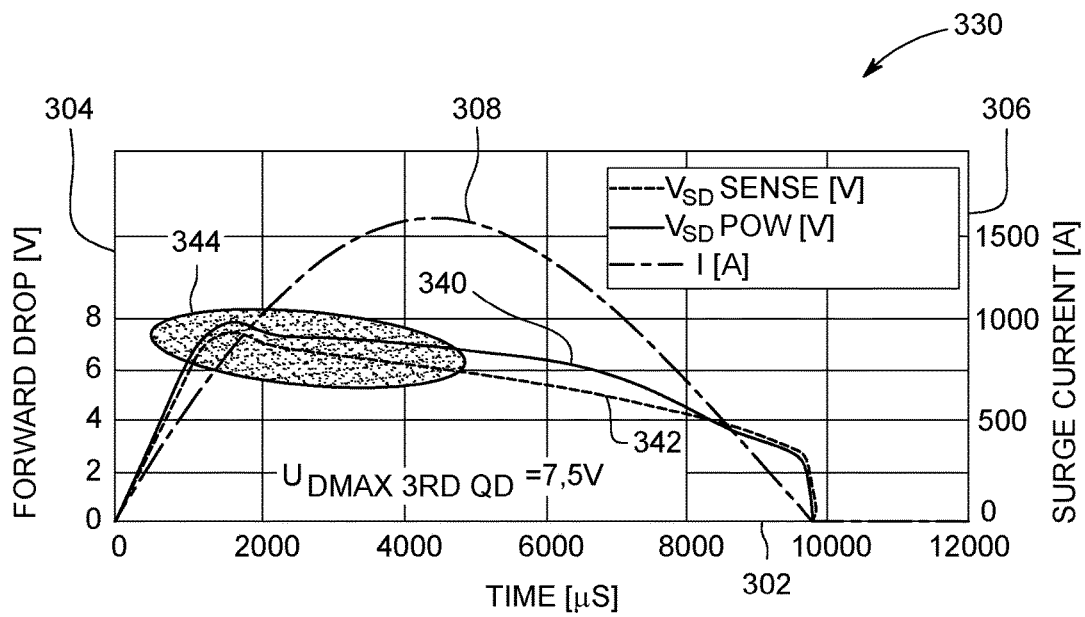
FIG. 6A is a chart illustrating the voltage drop response of the SiC switch of FIG. 5A operating in reverse conduction mode during the current surge event, wherein the reverse current predominantly flows through the third quadrant conduction path of the switch, in accordance with an embodiment.
Figure 6B:
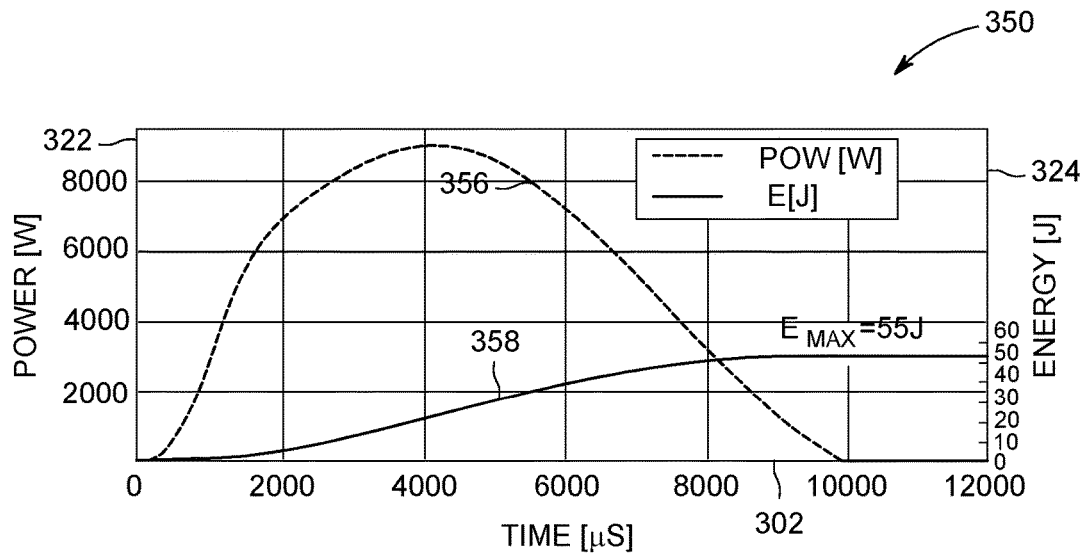
FIG. 6B is a chart illustrating the power dissipation response of the SiC switch of FIG. 5A operating in reverse conduction mode during the current surge event, wherein the reverse current predominantly flows through the third quadrant conduction path of the switch, in accordance with an embodiment.

As reference for comparison, charts 330 of FIG. 6A and 350 of FIG. 6B illustrate the response over time 302 of the SiC MOSFET switch 104 when the third quadrant conduction path is selected during the same current surge event represented in FIGS. 5A and 5B. As in chart 300 of FIG. 5A, curve 340 in FIG. 6A illustrates the $V_{SD}$ output across the switch 104 during the surge event, and curve 342 illustrates the $V_{SD}$ across the switch 104 as measured by the embodiment of the switch controller 102. As noted in region 344, the voltage drop while the third quadrant conduction path is selected may reach approximately 7.5 V, which is markedly higher than the peak voltage drop observed while the body diode conduction path is selected, as indicated in region 314 of FIG. 5A. It is recognized that the increase in the voltage drop may lead to an increased power dissipation, as illustrated in chart 350 of FIG. 6B. Curve 356 of FIG. 6B indicates that the power dissipated by the switch 104 during the current surge event may go well above 8000 W with the third quadrant conduction path selected, markedly higher than the peak power dissipated when the body diode conduction path is selected, as indicated by curve 326 in FIG. 5B. As a result, the accumulated power dissipated with the third quadrant conduction path selected may reach approximately 55 J, as illustrated by curve 358, which is higher than the power dissipated when the body diode conduction path is selected, as indicated by curve 328 in FIG. 5B. As discussed above, in order to select the third quadrant conduction path of the switch 104, the control terminal 109 may be set to a gate voltage (i.e., gate-source voltage, or $V_{GS}$) that maintains an open MOSFET channel between source and drain of the switch 104. In the illustrated example, the gate-source voltage is set to −15 V to select the third quadrant conduction path of the switch 104.

While the example embodiments discussed in the application are related to voltage switching devices, it should be understood that switch controllers and methods for operation thereof that may use sense currents may be designed. For example, a current sensor may be used to measure the reverse current at the drain and/or the source terminal. Method 150 of FIG. 2 may thus be adapted to employ a current threshold to perform the described comparison and decision. Moreover, while the illustrated examples focus on MOSFET devices and/or SiC transistor devices, the methods and systems discussed herein may be adapted for other switch that may have a body diode or an alternative current path that presents similar voltage-current relationship to the body diode characteristic relationship.

Technical effects of the embodiments presented herein include the use of high power switch devices (e.g., SiC MOSFET switches) that enable improved response during current surge events. As discussed herein, a switch operating in reverse conduction mode may be controlled to select either the third quadrant conduction path or the body diode conduction path to reduce voltage drop during current surge events, reducing the heat to be dissipated by the switch as a result of the surge. To that end, a switch controller may select the third quadrant conduction path of the switch during low current surge events, and the switch controller may select the body diode conduction path during high current surge events. As a result, the power dissipated in the switch during the surge events may be reduced, reducing the heat dissipation and the loss of energy in the system using the switch.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A switch controller configured to control a voltage-controlled power switch device, comprising:
   an output stage coupled to a control terminal of the voltage-controlled power switch device, wherein the output stage is configured to receive a driving signal and provide a driving voltage to the control terminal of the voltage-controlled power switch device;

a voltage sensor configured to provide a measurement of a voltage across the power switch device; and
a digital processing unit configured to receive a switching command and the measurement of the voltage, and to provide the driving signal to the output stage, wherein the digital processing unit is configured to:
compare the measurement with a limit voltage;
cause, using the driving signal, the output stage to provide a first voltage as the driving voltage when the digital processing unit receives the switching command and the measurement is above the limit voltage; and
cause, using the driving signal, the output stage to provide a second voltage as the driving voltage when the digital processing unit receives the switching command and the measurement is below the limit voltage.

2. The switch controller of claim 1, wherein the voltage-controlled power switch device comprises a metal-oxide semiconductor field effect transistor (MOSFET), and wherein the control terminal comprises a control terminal of the MOSFET.

3. The switch controller of claim 2, wherein the MOSFET comprises a silicon carbide (SiC) MOSFET.

4. The switch controller of claim 1, comprising a temperature sensor configured to determine a temperature of the voltage-controlled power switch device, and wherein the digital processing unit is configured to receive the temperature of the voltage-controlled power switch device from the temperature sensor and to determine the limit voltage based on the temperature of the voltage-controlled power switch device.

5. The switch controller of claim 4, wherein the digital processing unit is configured to increase the limit voltage upon receiving an increase in the temperature of the voltage-controlled power switch device.

6. The switch controller of claim 1, wherein the voltage sensor comprises:
a blocking diode configured to couple to a first terminal of the voltage-controlled power switch device;
a current source coupled to the blocking diode; and
an analog-to-digital converter (ADC) coupled to the blocking diode.

7. The switch controller of claim 1, wherein the first voltage comprises a gate source voltage of, approximately, 20 volts and wherein the second voltage comprises a gate source voltage of, approximately, −8 volts.

8. A system comprising switching circuitry, wherein the switching circuitry comprises:
a voltage-controlled power switch device coupled to a power source and a load; and
gate drive circuitry coupled the voltage-controlled power switch device, wherein the gate drive circuitry comprises a driver coupled to a control terminal of the power switch device and processing circuitry coupled to the driver, wherein the processing circuitry is configured to:
determine a current surge event across the voltage-controlled power switch device based on a measurement of the voltage-controlled power switch device;
configure the driver to provide a first voltage as a driving voltage to the voltage-controlled power switch device when there is no current surge event;
configure the driver to provide a second voltage as the driving voltage to the voltage-controlled power switch device when there is a current surge event;
receive a switching instruction; and
cause the driver to provide the driving voltage in response to receiving the switching instruction.

9. The system of claim 8, wherein the voltage-controlled power switch device comprises a metal-oxide-semiconductor field-effect transistor (MOSFET) device, and wherein the control terminal comprises a gate terminal.

10. The system of claim 9, wherein the first voltage is configured to open a drain-source channel of the MOSFET device, and wherein the second voltage is configured to close the drain-source channel of the MOSFET device.

11. The system of claim 9, wherein the MOSFET device comprises a silicon carbide (SiC) MOSFET device.

12. The system of claim 11, wherein the first voltage comprises, approximately, 20 volts, and wherein the second voltage comprises, approximately, −8 volts.

13. The system of claim 8, wherein the gate drive circuitry comprises voltage measurement circuitry that comprises a current source, a blocking diode coupled between the current source and a first terminal of the voltage-controlled power switch device, and an analog-to-digital converter (ADC) coupled to the blocking diode and the current source, and wherein the measurement of the voltage-controlled power switch device comprises a comparison between a voltage measured by the voltage measurement circuitry with a limit voltage.

14. The system of claim 13, where the processing circuitry is configured to:
receive temperature information associated with the voltage-controlled power switch device; and
determine the limit voltage based on the received temperature information.

15. The system of claim 8, wherein the voltage-controlled power switch device is configured to operate between approximately −10 degrees Celsius and 150 degrees Celsius.

16. The system of claim 8, wherein the system comprises a traction power converter that comprises the voltage-controlled power switch device.

17. The system of claim 8, wherein the system comprises a power supply that includes a buck converter that comprises the voltage-controlled power switch device.

18. The system of claim 8, wherein the surge event comprises a reverse current across the voltage-controlled power switch device of more than 1000 amperes.

19. A method to operate a metal-oxide-semiconductor field-effect transistor (MOSFET) device in a reverse current mode using a gate drive controller, comprising:
measuring a drain-source voltage between a drain of the MOSFET device and a source of the MOSFET device;
comparing the measured drain-source voltage with a limit voltage to identify that the MOSFET devices is undergoing a surge event;
receiving a switching instruction;
upon receiving the switching instruction, providing to the MOSFET device a first gate-source voltage that causes the MOSFET device to operate in a body diode mode during the surge event; and
upon receiving the switching instruction, providing to the MOSFET device a second gate-source voltage that causes the MOSFET device to operate in a third-quadrant conduction mode, when outside the surge event.

20. The method of claim 19, wherein the MOSFET device comprises a silicon-carbide (SiC) device, and wherein the first gate-source voltage comprises approximately −8 volts, and wherein the second gate-source voltage comprises approximately 20 volts.

21. The method of claim 19, wherein measuring the drain-source voltage comprises:
   providing a current from a current source to a blocking diode coupled to the drain of the MOSFET device; and
   measuring the source-drain voltage by measuring a voltage at the connection between the current source and the blocking diode.

22. The method of claim 19, wherein before comparing the measured drain-source voltage with the limit voltage, the method comprises:
   measuring a junction temperature of the MOSFET device; and
   adjusting the limit voltage based on the junction temperature.

23. The method of claim 22, wherein adjusting the limit voltage based on the junction temperature comprises retrieving the limit voltage from a look-up table stored in a memory of the gate drive controller based on the estimated junction temperature.

* * * * *